(12) United States Patent
Ohno et al.

(10) Patent No.: US 7,738,258 B2
(45) Date of Patent: Jun. 15, 2010

(54) SEMICONDUCTOR MOUNTING BOARD

(75) Inventors: Masaki Ohno, Gifu (JP); Masanori Tamaki, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 343 days.

(21) Appl. No.: 11/391,375

(22) Filed: Mar. 29, 2006

(65) Prior Publication Data
US 2006/0163740 A1 Jul. 27, 2006

Related U.S. Application Data

(63) Continuation of application No. PCT/JP2005/003409, filed on Feb. 23, 2005.

(30) Foreign Application Priority Data
Feb. 24, 2004 (JP) ............................. 2004-047714

(51) Int. Cl.
H05K 7/00 (2006.01)
(52) U.S. Cl. .................. 361/767; 361/760; 361/790; 361/808; 361/735; 361/728; 174/255; 174/262; 174/264
(58) Field of Classification Search ............... 361/760, 361/767, 768, 771, 790–792, 728, 729, 733, 361/735, 736, 748, 749, 730, 720; 174/26–266; 257/762, 736
See application file for complete search history.

(56) References Cited

U.S. PATENT DOCUMENTS

| 5,574,630 | A  | * | 11/1996 | Kresge et al. | ............... | 361/792 |
| 6,239,983 | B1 | * | 5/2001  | Shingai et al. | .............. | 361/768 |
| 6,376,049 | B1 | * | 4/2002  | Asai et al. | ................... | 428/209 |
| 6,525,275 | B1 |   | 2/2003  | Asai |  |  |
| 6,600,220 | B2 | * | 7/2003  | Barber et al. | ............... | 257/685 |
| 6,828,510 | B1 | * | 12/2004 | Asai et al. | .................... | 174/255 |
| 6,875,921 | B1 |   | 4/2005  | Conn |  |  |
| 6,891,258 | B1 | * | 5/2005  | Alexander et al. | .......... | 257/678 |
| 6,930,258 | B1 | * | 8/2005  | Kawasaki et al. | ........... | 174/264 |
| 7,145,225 | B2 | * | 12/2006 | Lee | ............................ | 257/686 |

(Continued)

FOREIGN PATENT DOCUMENTS

EP 1 194 022 A1 4/2002

(Continued)

Primary Examiner—Dameon E Levi
Assistant Examiner—Hoa C Nguyen
(74) Attorney, Agent, or Firm—Oblon, Spivak, McClelland, Maier & Neustadt, L.L.P.

(57) ABSTRACT

A semiconductor mounting board 80 is prepared by electrically joining an IC chip 70 via an interposer 60 of high rigidity to external pads 41 and internal pads 43, which are formed on the uppermost surface of a build-up layer 30. When the IC chip 70 generates heat, since pads 41 are positioned away from the center, a large shearing stress is applied to the portions at which pads 41 are joined to the interposer 60 in comparison to the portions at which pads 43 are joined to the interposer 60. Here, pads 41 are formed at substantially flat wiring portions and thus when joined to the interposer 60 by means of solder bumps 51, voids and angled portions, at which stress tends to concentrate, are not formed in the interiors of solder bumps 51. The joining reliability is thus high.

11 Claims, 16 Drawing Sheets

U.S. PATENT DOCUMENTS

| | | | |
|---|---|---|---|
| 2002/0013009 A1* | 1/2002 | Ozawa | 438/15 |
| 2003/0002260 A1* | 1/2003 | Hasebe et al. | 361/720 |
| 2003/0168728 A1* | 9/2003 | Hiruma | 257/700 |
| 2004/0118604 A1 | 6/2004 | Dory et al. | |
| 2004/0246691 A1* | 12/2004 | Budell et al. | 361/767 |

FOREIGN PATENT DOCUMENTS

| | | |
|---|---|---|
| JP | 10-012990 A | 1/1998 |
| JP | 10-051146 A | 2/1998 |
| JP | 2000-091753 A | 3/2000 |
| JP | 2001-168531 A | 6/2001 |
| JP | 2003-046022 A | 2/2003 |
| JP | 2003-046024 A | 2/2003 |

* cited by examiner

Fig. 22

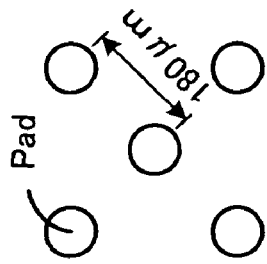

| | External pads | Via holes of internal pads | Number of heat cycles | | | | | | | |
|---|---|---|---|---|---|---|---|---|---|---|
| | | | 250 | 500 | 750 | 1000 | 1250 | 1500 | 2000 | |
| Example 1 | Only outermost surrounding array | No filled plating | ◎ | ◎ | ○ | ○ | △ | × | × | |
| Example 2 | Outermost surrounding array to 3rd surrounding array | No filled plating | ◎ | ◎ | ◎ | ○ | ○ | △ | × | |
| Example 3 | Outermost surrounding array to 5th surrounding array | No filled plating | ◎ | ◎ | ◎ | ◎ | ○ | △ | × | |
| Example 4 | Outermost surrounding array to 10th surrounding array | With filled plating | ◎ | ◎ | ◎ | ◎ | ◎ | ○ | ○ | |
| Example 5 | Only outermost surrounding array | With filled plating | ◎ | ◎ | ◎ | ◎ | ○ | ○ | × | |
| Example 6 | Outermost surrounding array to 3rd surrounding array | With filled plating | ◎ | ◎ | ◎ | ◎ | ◎ | ○ | △ | |
| Example 7 | Outermost surrounding array to 5th surrounding array | With filled plating | ◎ | ◎ | ◎ | ◎ | ◎ | ○ | ○ | |
| Example 8 | Outermost surrounding array to 10th surrounding array | With filled plating | ◎ | ◎ | ◎ | ◎ | ◎ | ◎ | ◎ | |
| Comparative Example 1 | None | No filled plating | ○ | ○ | × | × | × | × | × | |

| Array No. | Shearing Stress Ratio |
|---|---|
| 1 | 3.2 |
| 2 | 3.1 |
| 3 | 3 |
| 4 | 2.9 |
| 5 | 2.8 |
| 6 | 2.7 |
| 7 | 2.5 |
| 8 | 2.2 |
| 9 | 1.7 |
| 10 | 1.3 |
| 11 | 1.3 |
| 12 | 1.2 |
| 13 | 1.2 |
| 14 | 1.1 |
| 15 | 1.1 |

Fig. 24

| | Thickness Ratio ※1 | External pads | Via holes of internal pads | \multicolumn{7}{c}{Number of heat cycles} |
|---|---|---|---|---|---|---|---|---|---|---|
| | | | | 250 | 500 | 750 | 1000 | 1250 | 1500 | 2000 |
| Example 9 | 0.08/1 | Only outermost surrounding array | No filled plating | ◎ | ○ | △ | △ | × | × | × |
| Example 10 | 0.08/1 | Outermost surrounding array to 3rd surrounding array | No filled plating | ◎ | ○ | ○ | △ | × | × | × |
| Example 11 | 0.08/1 | Outermost surrounding array to 5th surrounding array | No filled plating | ◎ | ◎ | ○ | △ | × | × | × |
| Example 12 | 0.08/1 | Outermost surrounding array to 10th surrounding array | No filled plating | ◎ | ◎ | ◎ | △ | × | × | × |
| Example 13 | 0.1/1 | Only outermost surrounding array | No filled plating | ◎ | ○ | ○ | △ | × | × | × |
| Example 14 | 0.1/1 | Outermost surrounding array to 3rd surrounding array | No filled plating | ◎ | ◎ | ◎ | ○ | △ | × | × |
| Example 15 | 0.1/1 | Outermost surrounding array to 5th surrounding array | No filled plating | ◎ | ◎ | ◎ | ○ | △ | × | × |
| Example 16 | 0.1/1 | Outermost surrounding array to 10th surrounding array | No filled plating | ◎ | ◎ | ◎ | ◎ | ○ | × | × |
| Example 17 | 0.2/1 | Only outermost surrounding array | No filled plating | ◎ | ◎ | ○ | ○ | △ | × | × |
| Example 18 | 0.2/1 | Outermost surrounding array to 3rd surrounding array | No filled plating | ◎ | ◎ | ◎ | ○ | ○ | △ | × |
| Example 19 | 0.2/1 | Outermost surrounding array to 5th surrounding array | No filled plating | ◎ | ◎ | ◎ | ◎ | ○ | △ | × |
| Example 20 | 0.2/1 | Outermost surrounding array to 10th surrounding array | No filled plating | ◎ | ◎ | ◎ | ◎ | ◎ | ○ | ○ |
| Example 21 | 0.8/1 | Only outermost surrounding array | No filled plating | ◎ | ○ | ○ | △ | × | × | × |
| Example 22 | 0.8/1 | Outermost surrounding array to 3rd surrounding array | No filled plating | ◎ | ◎ | ◎ | ○ | △ | × | × |
| Example 23 | 0.8/1 | Outermost surrounding array to 5th surrounding array | No filled plating | ◎ | ◎ | ◎ | ○ | △ | × | × |
| Example 24 | 0.8/1 | Outermost surrounding array to 10th surrounding array | No filled plating | ◎ | ◎ | ◎ | ◎ | ○ | △ | × |
| Example 25 | 1/1 | Only outermost surrounding array | No filled plating | ◎ | ○ | △ | △ | × | × | × |
| Example 26 | 1/1 | Outermost surrounding array to 3rd surrounding array | No filled plating | ◎ | ◎ | ○ | △ | △ | × | × |
| Example 27 | 1/1 | Outermost surrounding array to 5th surrounding array | No filled plating | ◎ | ◎ | ○ | △ | × | × | × |
| Example 28 | 1/1 | Outermost surrounding array to 10th surrounding array | No filled plating | ◎ | ◎ | ◎ | △ | × | × | × |

※1 Thickness ratio = Interposer thickness / Thickness of printed wiring board (mm/mm)

Fig. 26

| | Thickness ratio ※1 | External pads | Via holes of internal pads | Ratio of holes ※2 | Number of heat cycles | | | | | | | |
|---|---|---|---|---|---|---|---|---|---|---|---|---|
| | | | | | 250 | 500 | 750 | 1000 | 1250 | 1500 | 2000 | |
| Example 29 | 0.4/1 | Only outermost surrounding array | No filled plating | 1/4 | ◎ | ◎ | ○ | ○ | △ | × | × | |
| Example 30 | | Only outermost surrounding array | No filled plating | 1/3 | ◎ | ◎ | ◎ | ◎ | ○ | ○ | △ | |
| Example 31 | | Only outermost surrounding array | No filled plating | 1/2 | ◎ | ◎ | ◎ | ◎ | ○ | ○ | △ | |
| Example 32 | | Only outermost surrounding array | No filled plating | 2/3 | ◎ | ◎ | ◎ | ◎ | △ | ○ | △ | |
| Example 33 | | Only outermost surrounding array | No filled plating | 1 | ◎ | ◎ | ○ | ○ | △ | × | × | |

※1 Thickness ratio = Interposer thickness／Thickness of printed wiring board(mm／mm)
※2 Ratio of holed = Number of via holes 36b／Number of internal pads

SEMICONDUCTOR MOUNTING BOARD

CROSS-REFERENCE TO RELATED APPLICATIONS

This is a continuation application of International Application No. PCT/JP2005/003409 filed on Feb. 23, 2005.

BACKGROUND OF THE INVENTION

1. Field of the Invention

This invention concerns a semiconductor mounting board.

2. Description of the Prior Art

With the progresses in integration circuit (IC) technologies in recent years, the number of input and output terminals of an IC chip is increasing. In order to accommodate for this, a flip-chip method is employed in some cases to mount an IC chip onto a printed wiring board. In this flip-chip method, the input and output terminals are positioned two-dimensionally in a lattice-like, zigzag, or other manner on the main plane of the IC chip, pads are formed at the corresponding positions on a surface of a printed wiring board formed of resin, and these components are joined by solder bumps. Since IC chip is significantly low in thermal expansion coefficient in comparison to a printed wiring board formed of resin, a shearing stress acts on solder bumps, as the joining material due to the thermal expansion coefficient difference of the two components when heat is generated during mounting or use of the IC chip. The solder bumps may thus break after temperature changes accompanying heat generation by the IC chip occur repeatedly. In one proposal, an interposer (relay substrate), having a thermal expansion coefficient intermediate of the thermal expansion coefficients of the IC chip and the printed wiring board, is interposed between the IC chip and the printed wiring board to relax the shearing stress (Japanese Published Unexamined Patent Application No. Hei 10-12990 (paragraph 0037)).

SUMMARY OF THE INVENTION

The present invention is directed to a semiconductor mounting board including: a core substrate; build-up layers, with each of which conductor layers having a wiring pattern formed thereon and insulating layers are laminated alternatingly on the core substrate; a pad set formed on an outermost insulating layer of the build-up layer; and an interposer that is electrically connected to the pad set. In the semiconductor mounting board, external pads in the pad set, which are formed at a predetermined external area, have a substantially flat shape.

With this semiconductor mounting board, a semiconductor electronic element is electrically connected via the interposer to the pad set that is formed on the outermost insulating layer of the build-up layer. When the semiconductor electronic element generates heat, a large shearing stress is applied to the joining portions of the interposer and the external pads in comparison to the joining portions of the interposer and internal pads which, of the pad set, are formed in an internal area at the inner side of the external area. Since the external pads are formed to be substantially flat, voids (air gaps) and angled portions will not be formed inside the joining material when the external pads are joined to the interposer by the joining material, such as solder. Since voids and angled portions, at which stress tends to concentrate readily, do not exist at the joining portions of the external pads and the interposer, these joining portions will not break readily. Thus with this semiconductor mounting board, the joining reliability can be maintained over a long term. The internal pads may be of substantially flat shape or may be via holes as shall be described later.

In one modified structure of the semiconductor mounting board of the invention, the external pads are connected to a wiring pattern that is formed at portions of an outermost conductor layer on the outermost insulating layer and at the outer sides of the pad set, and internal pads among the pad set, which are formed in an internal area at the inner side of the external area, are connected to either of the external pads and a conductor layer formed below the outermost insulating layer. With this modified structure, since, at the surface of the outermost insulating layer, there is no need to draw out wiring to the outer sides of the pad set from the internal pads, the wiring pattern of the outermost conductor layer that is formed at the outer sides of the pad set with respect to the external pads can be made dense. External pads may be connected via other external pads to the wiring pattern of the outermost conductor layer that is formed at the outer sides of the pad set.

In the semiconductor mounting board of the above modified structure, the internal pads may be via holes that pass through the outermost insulating layer. Though in this case, voids and angled portions may be formed when the internal pads and the interposer are joined by solder or other joining material, since the shearing stress that is applied to the joining portions of the internal pads is low in comparison the shearing stress applied to the joining portions of the external pads, breakage will not occur readily.

In the semiconductor mounting board of the above modified structure, the internal pads may include multiple internal pads, and at least two internal pads of the multiple internal pads may be electrically connected to each other on or above the substantially same surface as the top surface of the internal pads and thus are made into a group, and some of the internal pads in the group are formed as via holes that pass through the outermost insulation layer while the others in the group are formed not as via holes but in flat shape. Since by doing so, the number of internal pads that are to be formed as via holes can be lessened, a high density can be realized. In this case, the ratio of the number of the internal pads, which, among the multiple internal pads, are formed as the via holes, with respect to the total number of the multiple internal pads is preferably ⅓ to ⅔.

In the semiconductor mounting board of the above modified structure, the via holes are preferably filled with a conductive material (for example, copper or copper alloy). Since by doing so, voids and angled portions will not be formed when the internal pads are joined to the interposer by solder or other joining material, stress will not be likely to concentrate and thus breakage is made even more unlikely to occur. A plating technique may be used to perform filling with the conductor material.

In the semiconductor mounting board of the invention, at least either of the core substrate and the insulating layers making up the build-up layers is preferably formed of resin, and the interposer is preferably formed of ceramic. Though a ceramic is high in rigidity, since a ceramic in many cases has a thermal expansion coefficient of a value that is intermediate the thermal expansion coefficient of a silicon chip or other semiconductor electronic element and the thermal expansion coefficient of a resin printed wiring board (for example, the core substrate may be formed of resin or the insulating layers of the build-up layers may be formed of resin), it is preferable as the material of the interposer. Though when such a ceramic interposer is used, the semiconductor electronic element and the printed wiring board will not warp readily in the same direction and the connection reliability will tend to degrade due to the rigidity of the ceramic interposer, by employing the present invention, the connection reliability can be maintained. The ceramic is not restricted in particular, and a zirconia based ceramic, alumina based ceramic, silica based ceramic, silica alumina based ceramic, glass, etc. can be cited as examples. Also in the case where a ceramic interposer is used, the thickness is preferably set in consideration of the endurance strength and is specifically set to not less than 0.1 times the thickness of the multilayer printed wiring board (for example, the core substrate+the build-up layers). With a thickness of less than 0.1 times, the ceramic interposer may break due to the stress applied to the interposer.

In the semiconductor mounting board of the invention, the thickness of the interposer is preferably set to 0.1 to 0.8 times (more preferably 0.2 to 0.4) the thickness of the printed wiring board having the core substrate and the build-up layers. With this thickness of the interposer, the durability in a heat cycle test with a semiconductor being mounted on the semiconductor mounting board is improved further.

In the semiconductor mounting board of the invention, the external pads may be the pads formed at the outermost surrounding array of the pad set. In this case, the joining reliability of the portions where the pads of the outermost surrounding array are joined to the interposer, which are the portions that receive the greatest shearing stress, can be improved.

In the semiconductor mounting board of the invention, the pad set may include pads arranged in at least 30 by 30 square pattern, and the external pads may be the pads included in an area from a first surrounding array to an n-th surrounding array (where n is an integer from 2 to 10), with the first surrounding array being the outermost surrounding array of the pad set. In this case, the joining reliability of the portions where the pads near the outermost surrounding array are joined to the interposer, which are the portions that receive comparatively high shearing stress, can be improved.

BRIEF DESCRIPTION OF THE DRAWINGS

FIG. 22 is a table of the results of a heat cycle test on Examples 1 to 8 and a Comparative Example 1.

FIG. 24 is a table of the results of a heat cycle test on Examples 9 to 28.

FIG. 26 is a table of the results of a heat cycle test on Examples 29 to 33.

BEST MODES FOR CARRYING OUT THE INVENTION

Figure 1:
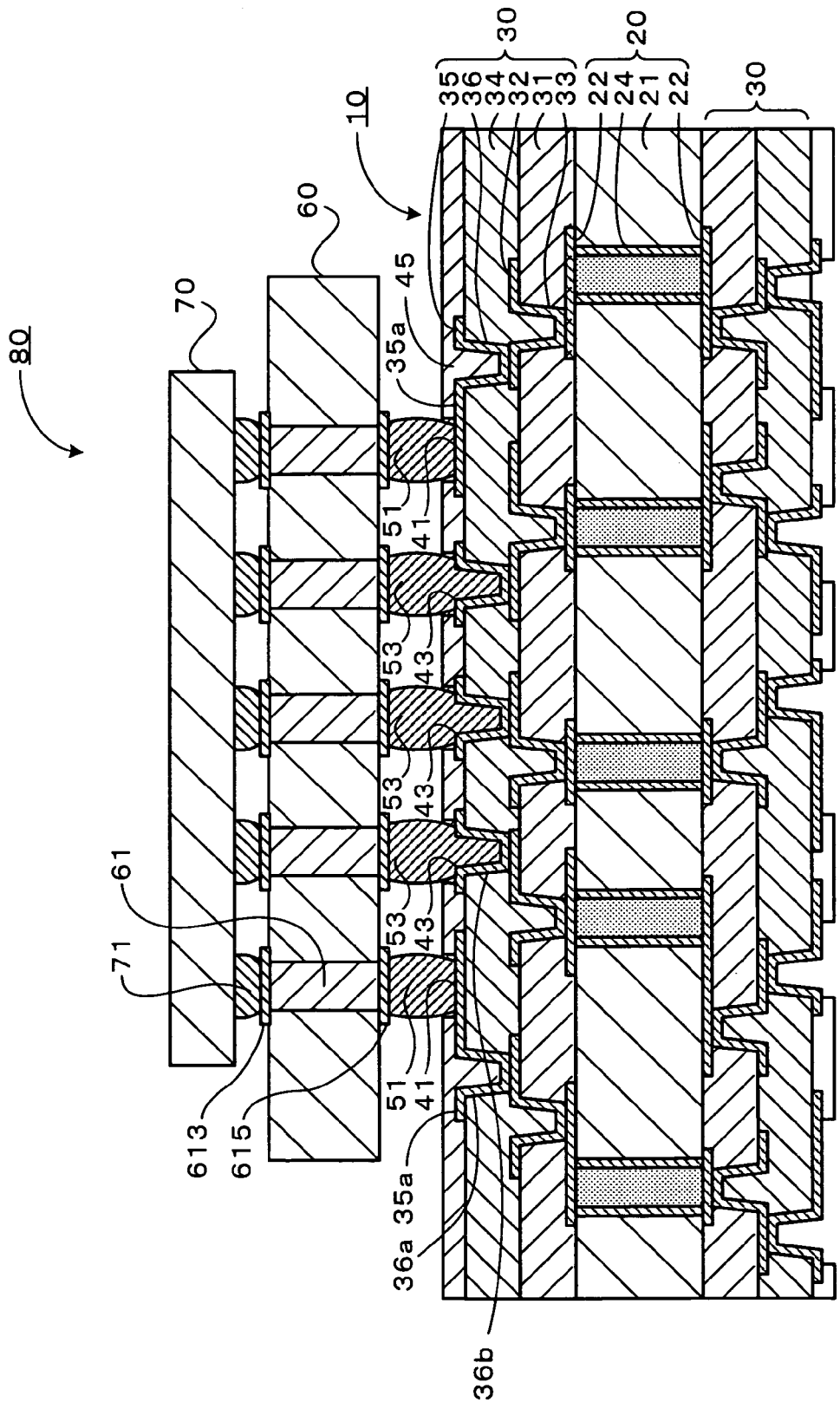
FIG. 1 is a schematic sectional view of the structure of a semiconductor mounting board.
Figure 2:
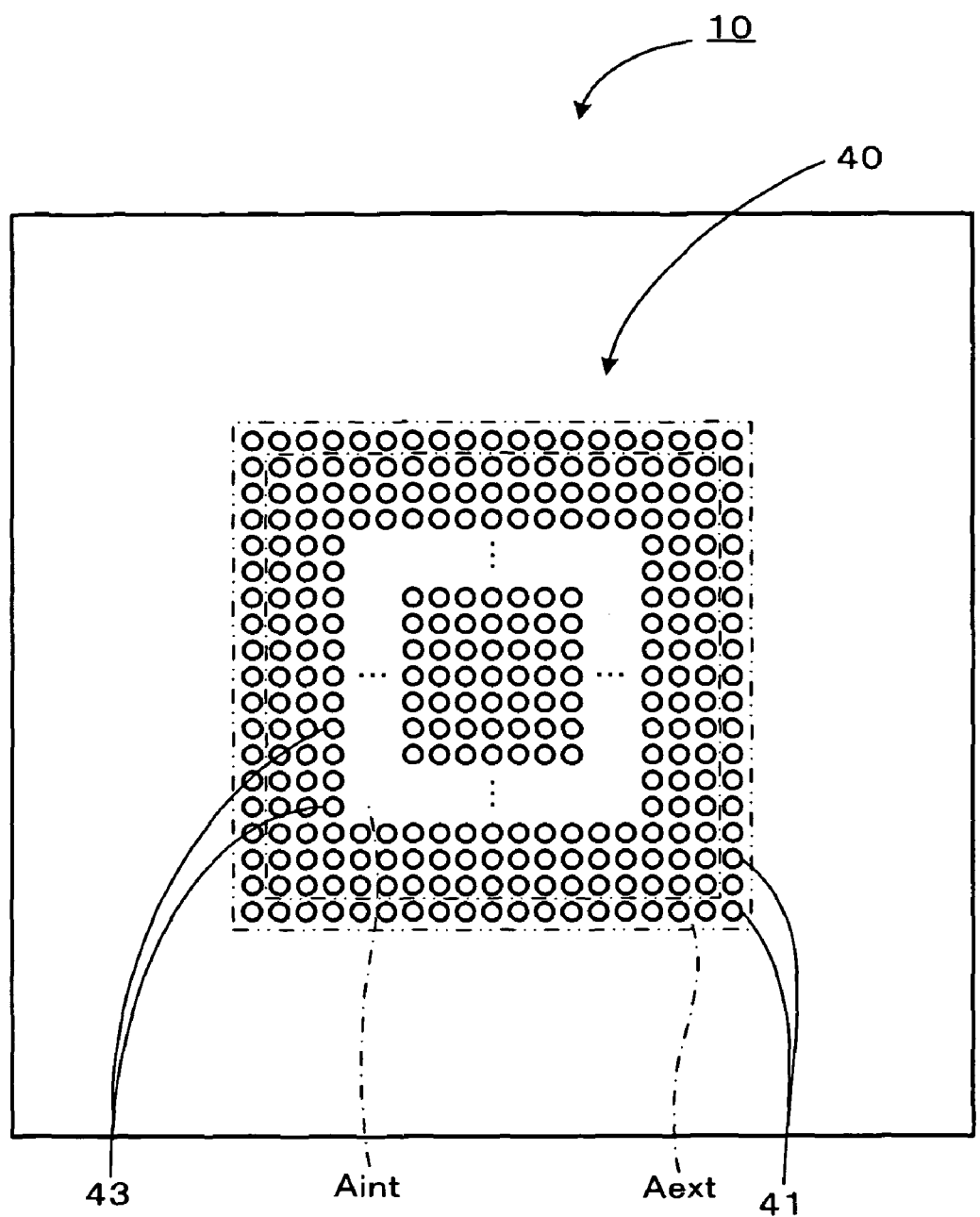
FIG. 2 is a plan view of the multilayer printed wiring board.

An embodiment of the present invention shall now be described with reference to the drawings. FIG. 1 is a schematic sectional view of a semiconductor mounting board 80, with an IC chip 70 mounted thereon, and FIG. 2 is a plan view of a multilayer printed wiring board 10. Though the expressions "upper" and "lower" shall be used below, these simply express relative positional relationships for descriptive purposes and, for example, upper and lower sides may be interchanged or upper and lower sides may be replaced by left and right sides.

Figure 10:
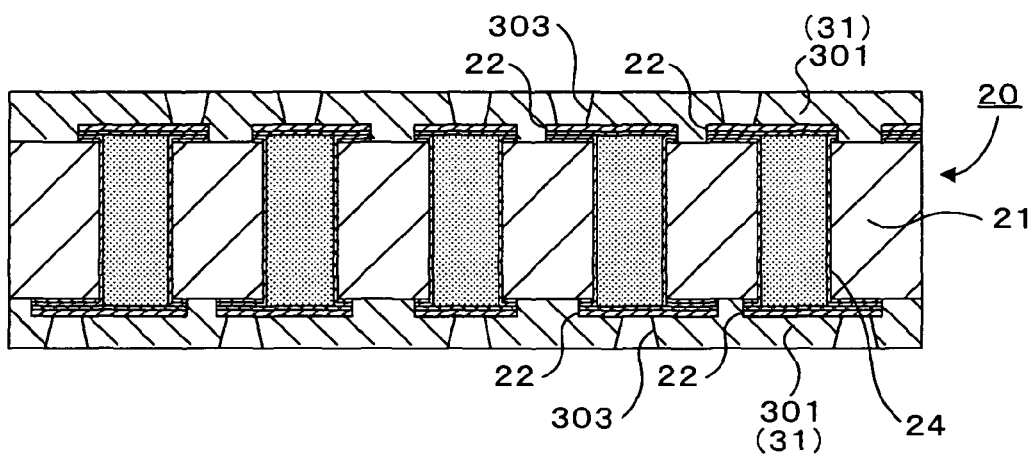
FIG. 10 is a diagram showing the manufacturing process of the multilayer printed wiring board.

As shown in FIG. 10, the multilayer printed wiring board 10 of this embodiment includes a core substrate 20, in which wiring patterns 22 formed on both the upper and lower surfaces are electrically connected to each other via through hole conductors 24, build-up layers 30 formed above and below the core substrate 20, and a pad set 40 (see FIG. 2) formed on the uppermost surface of a build-up layer 30. The semiconductor mounting board 80 is prepared by electrically connecting an interposer 60 with the multilayer printed wiring board 10. Also, an IC chip 70, which is an electronic element (having a thermal expansion coefficient of approximately 3.5 ppm/° C.), is electrically connected to the interposer 60 of the semiconductor mounting board 80.

The core substrate 20 has wiring patterns 22 formed of copper at both the upper and lower surfaces of a core substrate main body 21 formed of BT (bismaleimide-triazine) resin or a glass epoxy resin, etc., and through hole conductors 24 formed of copper on inner peripheral surfaces of through holes that pass through from the top to back of the core substrate main body 21. The wiring patterns 22 at the respective surfaces are electrically connected via through hole conductors 24. In the present embodiment, the core substrate 20 has a thickness of 800 μm and a thermal expansion coefficient of approximately 12 to 20 ppm/° C.

The build-up layers 30 are arranged by laminating insulating layers and conductor layers alternatingly on both the upper and lower surfaces of the core substrate 20. Examples of the resin insulating layer includes a modified epoxy based resin sheet, a polyphenylene ether based resin sheet, a polyimide based resin sheet, a cyanoester based resin sheet, etc., and the thickness thereof is preferably approximately 20 to 80 μm. These sheets may have an inorganic filler of glass, alumina, zirconia, etc., dispersed therein. In the build-up layer 30 of the present embodiment, a first resin insulating layer 31, a first conductor layer 32, a second resin insulating layer 34, and a second conductor layer 35 are layered in this order on the upper surface of the core substrate 20. The wiring pattern 22 of the core substrate 20 is electrically connected to the first conductor layer 32 through first via holes 33, and the first conductor layer 32 and the second conductor layer 35 are electrically connected through first via holes 36. Such a build-up layer 30 is formed by any of known subtractive methods and additive methods (including semi-additive methods and full additive methods), and the forming method shall be described later. The second resin insulating layer 34 corresponds to the outermost insulating layer of the invention, and the second conductor layer 35 corresponds to the outermost conductor layer of the invention.

The pad set 40 is a set of external pads 41 and internal pads 43 formed on the upper surface of the second resin insulating layer 34 that makes up the build-up layer 30. In the pad set 40 of the present embodiment, pads 41 and 43 are arranged in a 45 by 45 substantially square pattern with lattice arrangement as shown in FIG. 2 (" . . . " in FIG. 2 indicates that illustration of some pads are omitted), and each of the pads 41 and 43 is disposed at a position corresponding to an external pad that is formed on the lower surface of interposer 60. Also as shown in FIG. 2, the outermost surrounding array of the pad set 40 is referred to as an "external area Aext" and the area at the inner side of the external area Aext is referred to as "internal area Aint. The pads positioned in the external area Aext are referred to as "external pads 41," and the pads positioned in internal area Aint are referred to as "internal pads 43." Though the pads 41 and 43 are positioned in a lattice-like manner in FIG. 2, the positioning is not limited thereto. The pads may be otherwise positioned, for example, in a zigzag manner, or a portion of the pads may be positioned in a lattice-like manner while the remaining pads may be positioned in a zigzag or random manner, or a portion of the pads may be positioned in a zigzag manner while the remaining pads may be positioned in a lattice-like or random manner, or a portion of the pads may be positioned in a random manner and the remaining pads may be positioned in a lattice-like or zigzag manner, or all of the pads may be positioned in a random manner.

The external pads 41 are electrically connected to the IC chip 70 via the interposer 60 of high rigidity. The external pads 41 are formed on substantially flat wiring portions of a wiring pattern 35a, with which the second conductor layer 35 of the build-up layer 30 is drawn out in external directions. Wiring pattern 35a, on which external pads 41 are formed, is electrically connected to the first conductor layer 32 below through via holes 36a whish are formed at positions further outward than the external pads 41 among the second via holes 36a.

The internal pads 43 are electrically connected to the IC chip 70 via the interposer 60 of high rigidity. The internal pads 43 pass through portions of the second resin insulating layer 34 of build-up layer 30 that are located substantially below and are joined to the first conductor layer 32 without being drawn out in external directions on the upper surface of the resin insulating layer 34, and here, are formed so as to include the second via holes 36b, which pass through the second resin insulating layer 34, and portions of the second conductor layer 35 that are peripheral to the openings of via holes 36b.

The interposer 60 is a ceramic substrate, and includes multiple conductor posts 61 passing through from the upper surface to the lower surface, lands 613 formed on the upper surface sides of the conductor posts 61, and lands 615 formed on the lower surface sides of the conductor posts 61. The interposer 60 has a thermal expansion coefficient of approximately 7 ppm/° C. and a thickness of 400 μm. In the interposer 60, the lands 613 are electrically joined via solder bumps 71 to input and output terminals disposed on a back surface of the IC chip 70 and the lands 615 are electrically joined via solder bumps 51 and 53 to external pads 41 and internal pads 43 that make up the pad set 40 of the multilayer printed wiring board 10.

Figure 3:
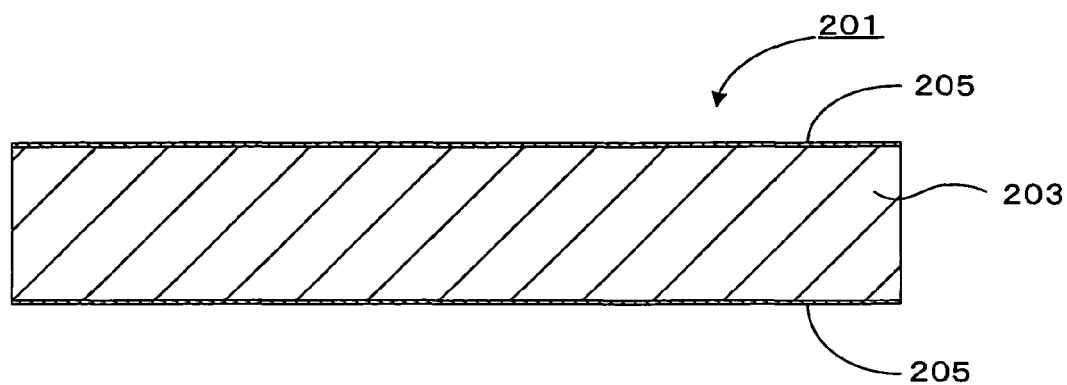
FIG. 3 is a diagram showing a manufacturing process of the multilayer printed wiring board.
Figure 4:
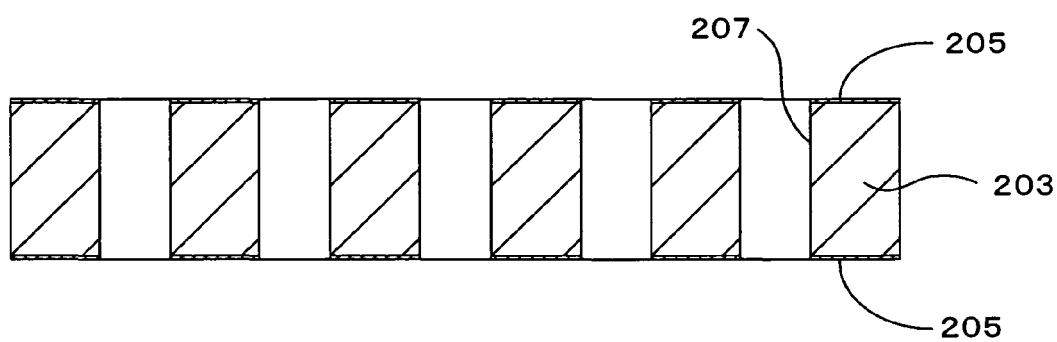
FIG. 4 is a diagram showing the manufacturing process of the multilayer printed wiring board.

An example of manufacture of multilayer printed wiring board 10 shall now be described based on FIGS. 3 to 19. Here, a copper-laminated plate 201, in which copper foils 205 are laminated on both surfaces of an insulating substrate 203 formed of a glass epoxy resin or BT (bismaleimide triazine) resin, was used as the starting material (see FIG. 3). The thickness of each copper foil 205 is preferably approximately 18 to 150 μm and not less than 1.2 times the thickness of a copper plating film to be formed on the build-up layer 30 subsequently. When the thickness is in this range, erroneous operation of IC chip due to dropping of power will not occur. Though the copper-laminated plate 201 is used as the core substrate 20 in the present example, a multilayer core may be used instead. When a multilayer core is used, the thickness of copper of an inner layer is preferably thicker than the thickness of copper at the top and back sides, so as to allow the build-up layers 30 on the core substrate 20 to be flat.

Figure 5:
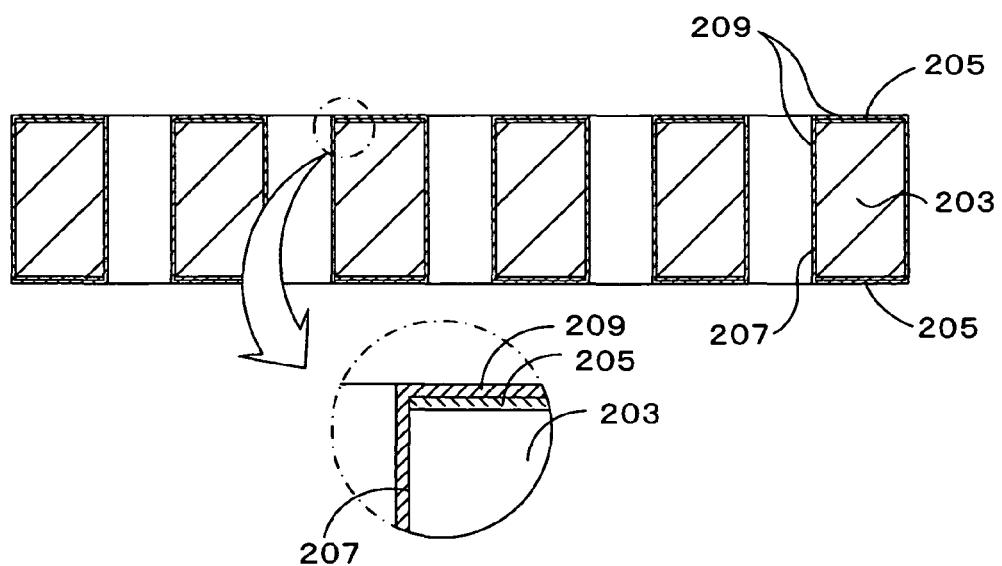
FIG. 5 is a diagram showing the manufacturing process of the multilayer printed wiring board.
Figure 6:
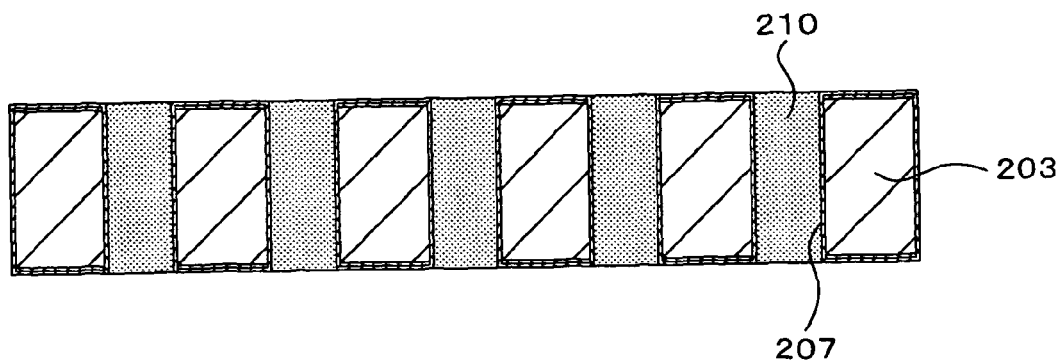
FIG. 6 is a diagram showing the manufacturing process of the multilayer printed wiring board.
Figure 7:
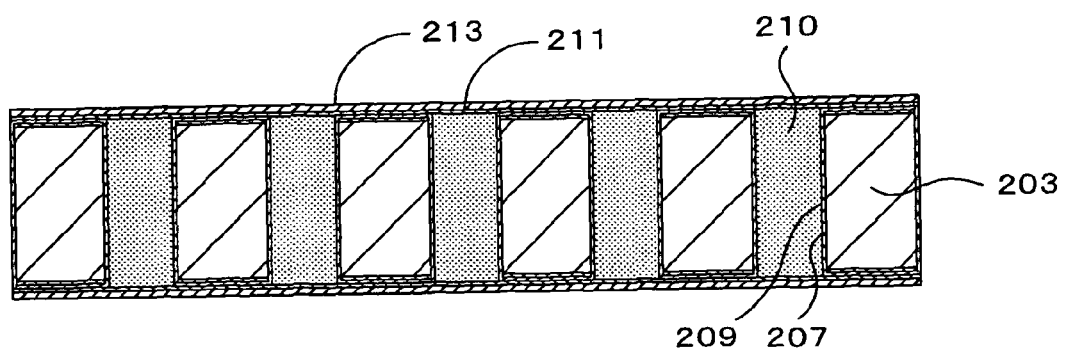
FIG. 7 is a diagram showing the manufacturing process of the multilayer printed wiring board.

Through holes 207 were formed in the copper foils 205 by a drill (see FIG. 4), and a plating layer 209 was formed by electroless plating and electrolytic plating (see FIG. 5). This substrate was then subject to a blackening process in a blackening bath (oxidizing bath) of an aqueous solution containing NaOH (10 g/l), NaClO$_2$ (40 g/l), and Na$_3$PO$_4$ (6 g/l) and then to a reducing process in a reducing bath of an aqueous solution containing NaOH (10 g/l) and NaBH$_4$ (6 g/l), so as to roughen the plating layer 209 that covers the upper and lower surfaces of the copper-laminated plate 201 and the surfaces of the through holes 207.

Then, filling the interiors of through holes 207 with a through hole filling resin composition 210 using a squeegee (see FIG. 6), drying at 100° C. was carried out for 20 minutes. The through hole filling resin composition 210 was prepared as follows. That method prepared 100 weight parts of bisphenol F epoxy monomer (trade name: YL983U; made by Yuka Shell Epoxy Co., Ltd.; molecular weight: 310), 72 weight parts of spherical SiO$_2$ particles that have an average particle diameter of 1.6 μm and a maximum particle diameter of not more than 15 μm and have a silane coupling agent coated on the surface (trade name: CRS1101-CE; made by Adtec Co., Ltd.), and 1.5 weight parts of a leveling agent (trade name: Pellenol S4; made by SAN NOPCO Ltd.) in a container and stirred and mixed these materials to obtain the resin composition with a viscosity at 23±1° C. of 30 to 60 Pa·s. As a curing agent, 6.5 weight parts of an imidazole curing agent (trade name: 2E4MZ-CN; made by Shikoku Corp.) was used. The substrate filled with the through hole filling resin composition 210 was then polished and flattened until the conductor surfaces became exposed, and through hole filling resin composition 210 was then cured by heating at 100° C. for 1 hour and at 150° C. for 1 hour.

The substrate that had been subject to the above heating process was immersed in a catalyst solution containing palladium chloride ($PdCl_2$) and stannous chloride ($SnCl_2$) to precipitate palladium metal and thereby add a catalyst on the surfaces of the substrate. The substrate was then immersed in an aqueous electroless copper plating solution to form electroless copper plating films 211 of 0.6 to 3.0 µm thickness on the substrate surfaces. The composition of the aqueous electroless copper plating solution used was: 0.03 mol/l of copper sulfate, 0.200 mol/l of EDTA, 0.1 g/l of HCHO, 0.100 mol/l of NaOH, 100 mg/l of a,a'-bipyridyl, and 0.10 g/l of polyethylene glycol (PEG). The electroless copper plating was carried out for 40 minutes at a liquid temperature of 34° C. Electrolytic copper plating was then carried out to form electrolytic copper plating films 213 of 20 µm thickness on electroless copper plating films 213 (see FIG. 7). The composition of the electrolytic copper plating solution used was: 200 g/l of sulfuric acid, 80 g/l of copper sulfate, and 19.5 ml/l of an additive (Cupracid GL, made by ATOTECH Japan Co., Ltd.). The electrolytic copper plating was carried out under the conditions of a current density of 1 $A/dm^2$, a duration of 100 minutes, and a temperature of 22±2° C.

Figure 8:
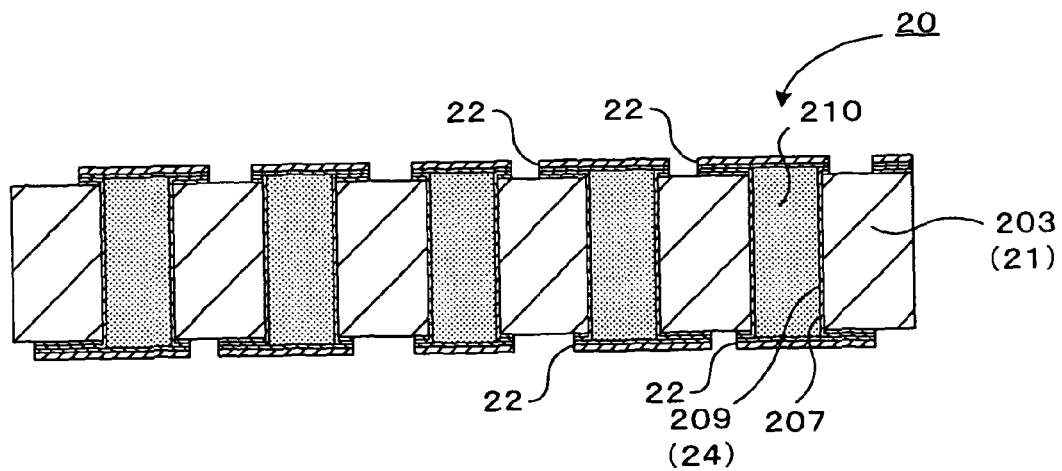
FIG. 8 is a diagram showing the manufacturing process of the multilayer printed wiring board.
Figure 9:
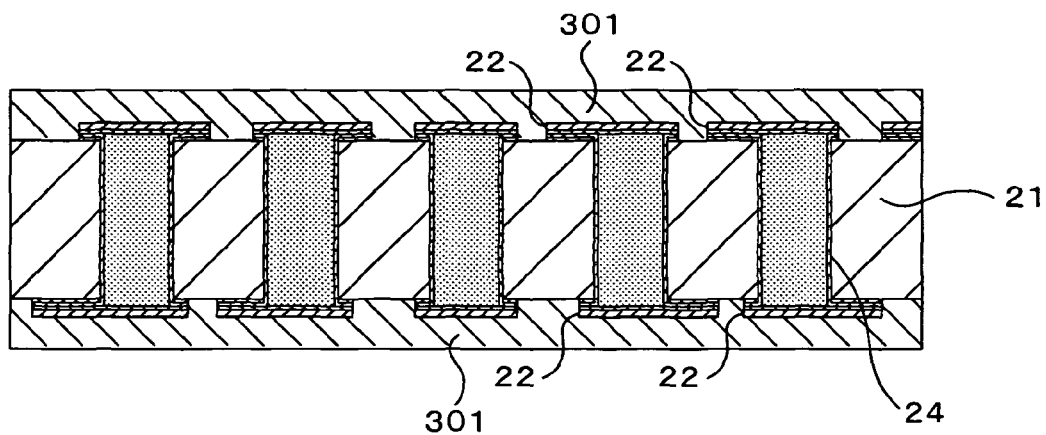
FIG. 9 is a diagram showing the manufacturing process of the multilayer printed wiring board.

The substrate was subject to pattern etching by a normal photographic method and thereby made into the core substrate 20 having wiring patterns 22 on both the upper and lower surfaces (see FIG. 8). The insulating substrate 203 becomes the core substrate main body 21 and the plating layer 209 inside through holes 207 becomes the through hole conductors 24. The surfaces of wiring patterns 22 were roughened by a blackening process, insulating layer resin films 301 were adhered by performing vacuum press lamination at 0.5 MPa while raising the temperature to 50 to 150° C. (see FIG. 9). Each of these insulating layer resin films 301 was prepared as follows. The method first mixed and stirred 40 weight parts of bisphenol A epoxy monomer (trade name: E-1001; made by Yuka Shell Epoxy Co., Ltd.), 60 weight parts of phenol novolac epoxy resin (trade name: E-154; made by Yuka Shell Epoxy Co., Ltd.), and 5 weight parts of imidazole curing agent (trade name: 2PHZ; made by Shikoku Corp.), using a three-roll mill, so as to prepare a film precursor. Then, the method applied the film precursor onto a polymethylpentene (TPX) (trade name: Opulan X-88; made by Mitsui Petrochemical Industries Ltd.; softening point: 180° C.) film of 50 µm thickness using a roll coater (made by Cermatronics Boeki Co., Ltd.), and dried and cured for 2 hours at 80° C., 5 hours at 120° C., and 2 hours at 150° C. to form the insulating layer resin film of 40 µm thickness.

Then, using a mask that has a thickness of 1.2 mm and has through holes formed therein, through holes 303 of 60 to 100 µm diameter were formed in the insulating layer resin films 301 by means of a $CO_2$ gas laser of 10.4 µm wavelength and conditions of a beam diameter of 4.0 mm, top hat mode, a pulse width of 8.1 µsec, a mask through hole diameter of 1.0 mm, and 1 shot (see FIG. 10). Heat treatment at 150° C. was then carried out for 3 hours to completely cure insulating layer resin films 301 into first resin insulating layers 31. The substrate was then immersed for 10 minutes in a solution of 80° C. containing 60 g/L of permanganic acid, then immersed in a neutralizing solution (made by Shipley Company L.L.C), and washed with water. Catalyst nuclei were then attached to the surfaces of first resin insulating layers 31 (including the inner wall surfaces of through holes 303) by the addition of a palladium catalyst. That is, the substrate was immersed in a catalyst solution containing palladium chloride ($PdCl_2$) and stannous chloride ($SnCl_2$) to precipitate palladium metal and thereby add the catalyst.

Figure 11:
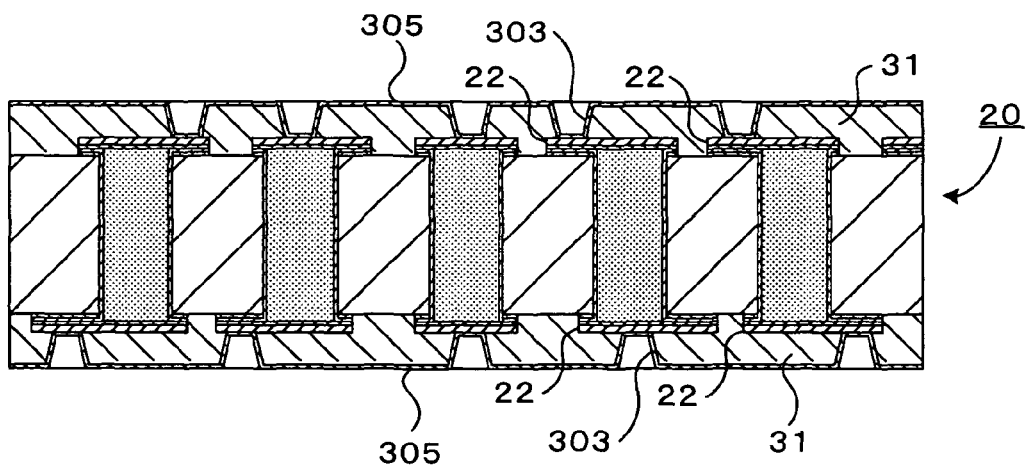
FIG. 11 is a diagram showing the manufacturing process of the multilayer printed wiring board.

The substrate was then immersed in an aqueous electroless copper plating solution to form electroless copper plating films 305 of 0.6 to 3.0 µm thickness on the surfaces of first resin insulating layers 31 (including the inner wall surfaces of through holes 303) (see FIG. 11). The composition of the aqueous electroless copper plating solution used was: 1.03 mol/l of copper sulfate, 0.200 mol/l of EDTA, 0.1 g/l of HCHO, 0.100 mol/l of NaOH, 100 mg/l of a,a'-bipyridyl, and 0.10 g/l of polyethylene glycol (PEG). The electroless copper plating conditions were 40 minutes at a liquid temperature of 34° C.

Figure 12:
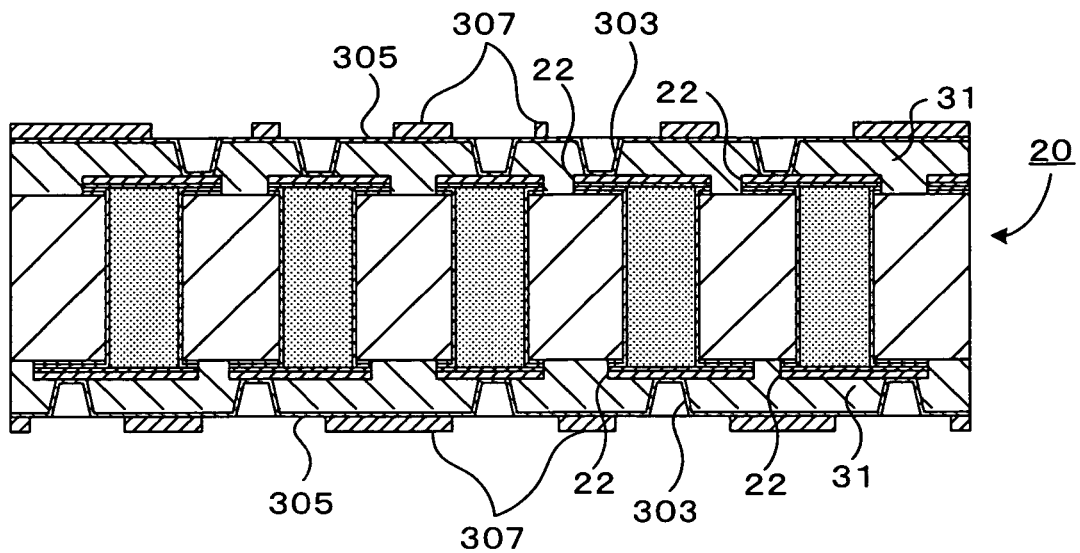
FIG. 12 is a diagram showing the manufacturing process of the multilayer printed wiring board.
Figure 13:
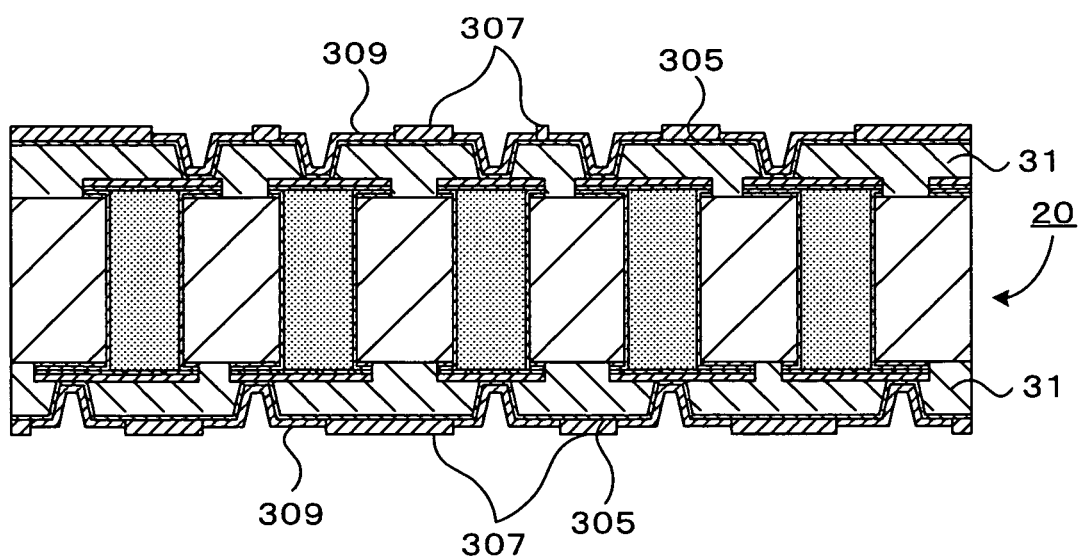
FIG. 13 is a diagram showing the manufacturing process of the multilayer printed wiring board.

Then, commercially available photosensitive dry films were adhered on the substrate on which electroless copper plating films 305 had been formed, exposure at 110 $mJ/cm^2$ was carried out with masks placed thereon, and developing with a 0.8% aqueous sodium carbonate solution was carried out, so as to form plating resists 307 of 25 µm thickness (see FIG. 12). The substrate was washed with water at 50° C. to be degreased, washed with water at 25° C., washed with sulfuric acid, and subject to electrolytic copper plating, thereby forming electrolytic copper plating films 309 of 20 µm thickness at the portions at which the plating resists were not formed (see FIG. 13). The composition of the electrolytic copper plating solution used was: 200 g/l of sulfuric acid, 80 g/l of copper sulfate, and 19.5 ml/l of an additive (Cupracid GL, made by ATOTECH Japan Co., Ltd.). The electrolytic copper plating was carried out under the conditions of a current density of 1 $A/dm^2$, a duration of 100 minutes, and a temperature of 22±2° C.

Figure 14:
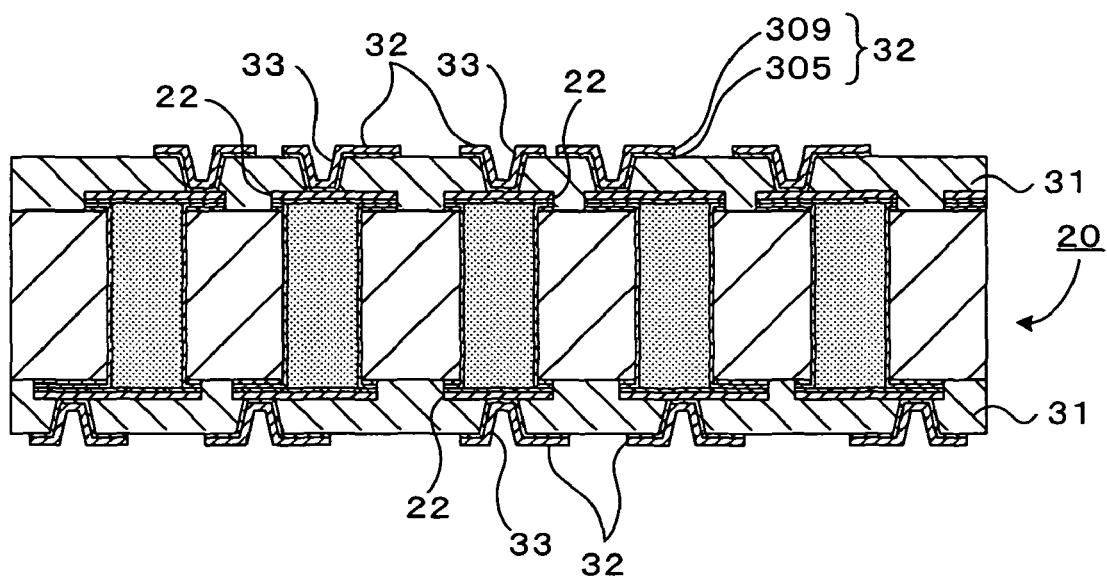
FIG. 14 is a diagram showing the manufacturing process of the multilayer printed wiring board.
Figure 15:
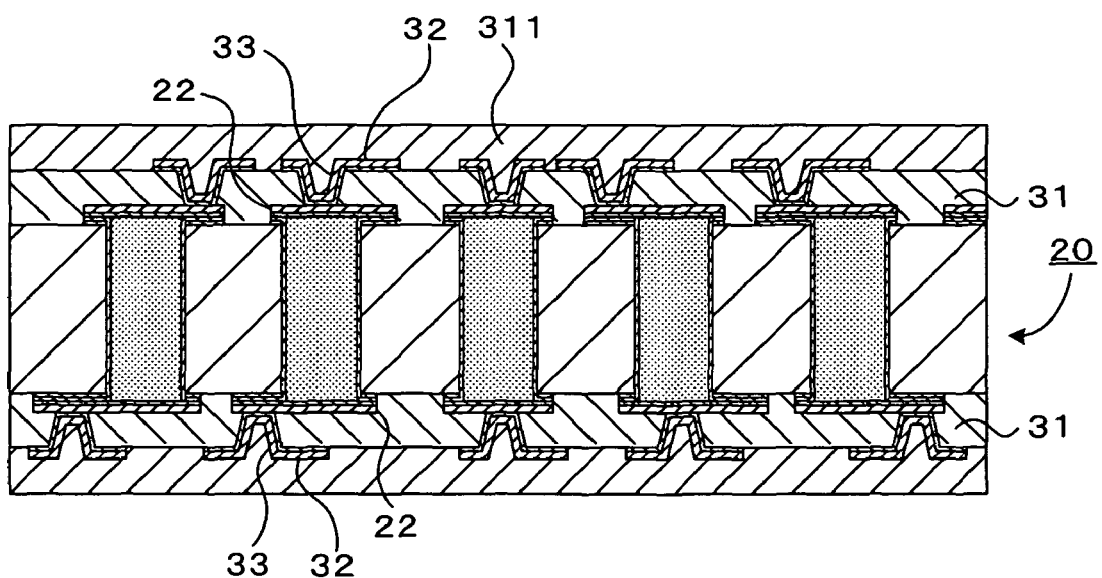
FIG. 15 is a diagram showing the manufacturing process of the multilayer printed wiring board.
Figure 16:
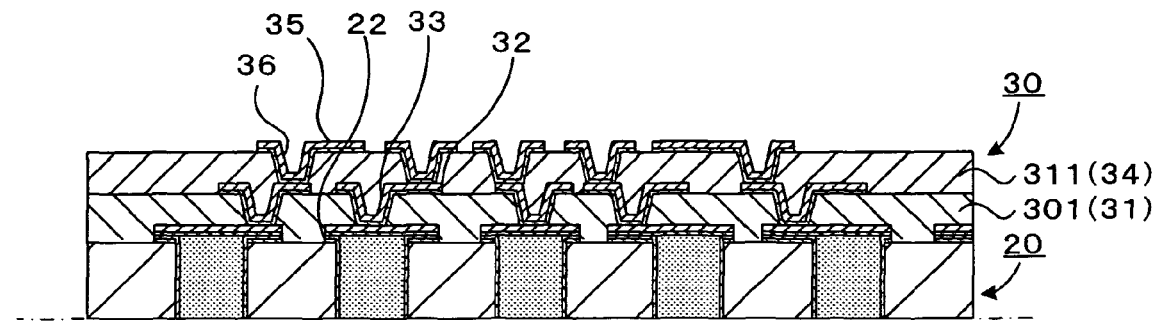
FIG. 16 is a diagram showing the manufacturing process of the multilayer printed wiring board.

After the electrolytic copper plating, plating resists 307 were peeled and removed using 5% KOH and electroless copper plating films 305 below the plating resists were subsequently removed by etching with a mixed solution of sulfuric acid and hydrogen peroxide solution to form first conductor layers 32, which are independent circuit patterns (see FIG. 14). Here, first conductor layers 32 are made continuous with wiring patterns 22 of the core substrate 20 through the first via holes 33. The substrate that had thus been subject to pattern forming was then subject to a blackening process in a blackening bath (oxidizing bath) of an aqueous solution containing NaOH (10 g/l), $NaClO_2$ (40 g/l), and $Na_3PO_4$ (6 g/l) and then to a reducing process in a reducing bath of an aqueous solution containing NaOH (10 g/l) and $NaBH_4$ (6 g/l), so as to roughen the surfaces of the first conductor layers 32 and the via holes 33.

Insulating layer resin films 311, which are the same as the insulating layer resin films 301, were then adhered by performing vacuum press lamination at 0.5 MPa while raising the temperature to 50 to 150° C. (see FIG. 15). Then by the same procedure as that for forming the first conductor layers 32 and the first via holes 33 on and in the insulating resin layer films 301 (first resin insulating layers 31), second conductor layers 35 and second via holes 36 were formed on and in the insulating layer resin films 311 (second resin insulating layers 34), thereby completing build-up layers 30 (see FIG. 16). From FIG. 16 onwards, just the upper half of the substrate section shall be illustrated.

Figure 17:
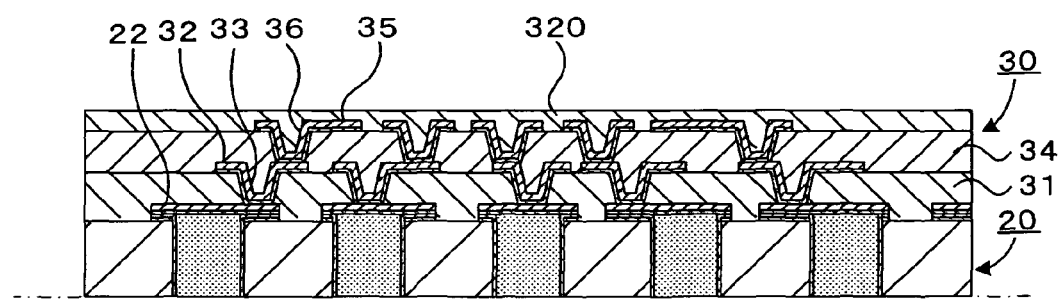
FIG. 17 is a diagram showing the manufacturing process of the multilayer printed wiring board.
Figure 18:
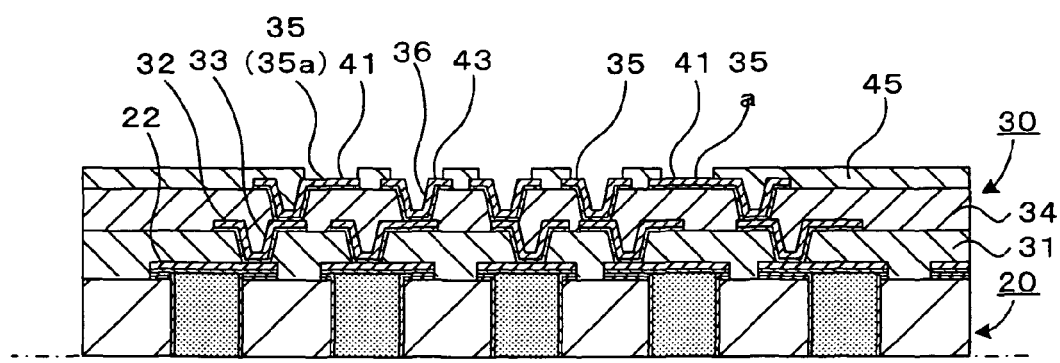
FIG. 18 is a diagram showing the manufacturing process of the multilayer printed wiring board.
Figure 19:
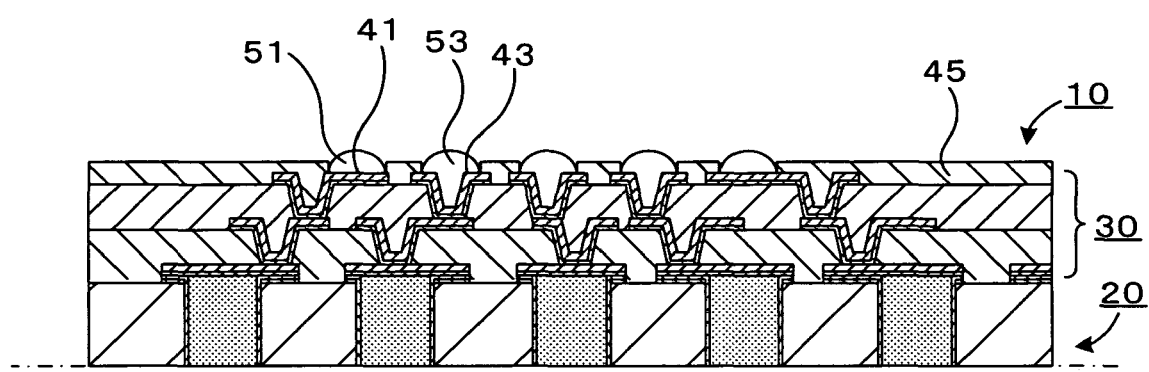
FIG. 19 is a sectional view of the multilayer printed wiring board.

A commercially available solder resist composition 320 was then coated to a thickness of 20 µm on both surfaces of the substrate in the middle of preparation (see FIG. 17). Then after performing a drying process of 20 minutes at 70° C. and then 30 minutes at 70° C., soda lime glass substrates, on each of which a pattern of circles (mask pattern) of solder resist openings are drawn by a chromium layer, were set so that the sides on which the chromium layers had been formed were put in close contact with the solder resist composition 320, exposure with ultraviolet rays of 1000 $mJ/cm^2$ was carried out, and development using a 1% aqueous sodium carbonate solution was carried out. Heating at 80° C. for 1 hour, 100° C. for 1 hour, 120° C. for 1 hour, and 150° C. for 3 hours was then carried out to form patterned solder resist layers 45, and predetermined, substantially flat wiring portions of wiring patterns 35a, formed at the outermost peripheries of second conductor layers 35, were opened and made into external pads 41, and via holes 36 and peripheral portions thereof of the other patterns of second conductor layers 35 than the outermost patterns were opened and made into internal pads 43 (see FIG. 18; the opening diameter was 180 μm).

The substrate on which solder resist layers 45 had been formed was then immersed for 20 minutes in an electroless nickel plating solution of pH 5, comprising 30 g/l of nickel chloride, 10 g/l of sodium hypophosphite, and 10 g/l of sodium citrate, to form nickel plating layers of 5 μm thickness on pads 41 and 43. The substrate was furthermore immersed for 23 seconds under the condition of 93° C. in an electroless gold plating solution, comprising 2 g/l of gold potassium cyanide, 75 g/l of ammonium chloride, 50 g/l of sodium citrate, and 10 g/l of sodium hypophosphite, to form a gold plating layer of 0.03 μm thickness on top of the nickel plating layer. By then printing on a solder paste on pads 41 and 43 that had been nickel plated and gold plated and performing reflow at 230° C., solder bumps 51 and 53 were formed, thereby completing the multilayer printed wiring board 10 (see FIG. 19). The thickness of this multilayer printed wiring board 10 was 1 mm. The IC chip 70 was then mounted via the interposer 60 onto the multilayer printed wiring board 10. The interval between the IC chip 70 and the interposer 60 and the interval between the interposer 60 and the multilayer printed wiring board 10 may be filled with an underfill.

A method of manufacturing the interposer 60 shall now be described with reference to FIG. 20. Here a zirconia substrate 601, which is an insulating substrate of 32 millimeters square and thickness of 400 μm, was used as the starting material. This zirconia substrate 601 had the Young's modulus measured by the three-point flexure method of 200 GPa. A urethane-based resist was formed on one surface of the zirconia substrate 601, and by a normal photographic method, openings of 100 μm diameter were formed at positions corresponding to the external electrodes of the IC. Using a sandblasting machine made by Makina Inc., through holes 603 of 100 μmf were formed by sandblasting from the side at which the resist had been formed and under the conditions provided below and thereafter, the resists were removed (see FIG. 20(a)). Through holes 603 were positioned so as to be in 1:1 correspondence with the external electrodes of the IC chip 70. In regard to the sandblasting conditions, the abrasive grains were formed of synthetic diamond, the average abrasive grain diameter was 25 μm, the pressure was 0.2 MP, and the number of shots was 60.

A metal film 605 was formed on the substrate 601, in which through holes 603 had been formed in the above-described manner. The method formed a chromium film of 0.1 μm by sputtering on the surfaces of the substrate 601 and the inner walls of through holes 603, and then vapor deposited a copper film of 0.14 μm on the chromium film, so as to form the metal film 605 (see FIG. 20(b)). The substrate 601 was then immersed in an aqueous electroless copper plating solution to form an electroless copper plating film 607 of 0.6 to 3.0 μm thickness on the surfaces of the substrate 601 and the inner walls of through holes 603 (see FIG. 20(c)). The composition of the aqueous electroless copper plating solution used was: 0.03 mol/l of copper sulfate, 0.200 mol/l of EDTA, 0.18 g/l of HCHO, 0.100 mol/l of NaOH, 100 mg/l of a,a'-bipyridyl, and 0.10 g/l of polyethylene glycol (PEG). The electroless copper plating conditions were 40 minutes at a liquid temperature of 34° C. Then using a plating solution and plating conditions with priority placed on deposition in through holes 603, the interiors of through holes 603 were filled and an electrolytic copper plating film 609 was formed on the surfaces of the substrate 601 (see FIG. 20(d)). The composition of the electrolytic copper plating solution used was: 150 g/l of sulfuric acid, 160 g/l of copper sulfate, and 19.5 ml/l of the additive. The electrolytic copper plating was carried out under the conditions of a current density of 6.5 A/dm$^2$, a duration of 80 minutes, a temperature of 22±2° C., and stirring by jet stirring.

Thereafter, both surfaces were polished until the surfaces of the substrate 601 became exposed. Nickel plating (5 μm) and gold plating (0.03 μm) were then applied over the copper plating on the via holes exposed at both surfaces, to thereby form lands 613 (see FIG. 20(e)). The nickel plating was carried out by immersion for 20 minutes in an electroless nickel plating solution of pH 5, comprising 30 g/l of nickel chloride, 10 g/l of sodium hypophosphite, and 10 g/l of sodium citrate. The gold plating was carried out by immersion for 23 seconds under the condition of 93° C. in an electroless gold plating solution, comprising 2 g/l of gold potassium cyanide, 75 g/l of ammonium chloride, 50 g/l of sodium citrate, and 10 g/l of sodium hypophosphite. Solder was then mask printed onto lands 613 and by thereafter performing reflow at 230° C., solder bumps 615 were formed, thereby completing the interposer 60 (see FIG. 20(f)). The solder printing may be omitted.

With the semiconductor mounting board 80 described in detail above, when the IC chip 70 generates heat, a large shearing stress is applied to the portions at which the external pads 41 are joined to the interposer 60 in comparison to the portions at which the internal pads 43 are joined to the interposer 60. However, since the external pads 41 are formed to be substantially flat, when the external pads are joined to interposer 60 by means of the solder bumps 51, voids will not be formed and angled portions will not be formed in the interiors of the solder bumps 51. Since voids and angled portions, at which stress tends to concentrate, thus do not exist at the portions at which the external pads 41 are joined to the interposer 60, the solder bumps 51 will not break readily. The reliability of joining can thus be maintained over a long term with the semiconductor mounting board 80.

In the semiconductor mounting board 80 described above, the external pads 41 are connected to the wiring pattern 35a formed at the outer sides of the pad set 40 on the second resin insulating layer 34, and the internal pads 43 are connected to the conductor layer 32 formed below the second resin insulating layer 34. With this structure, there is no need to draw out wirings to the outer sides of the pad set 40 from internal pads 43 on the surface of the second resin insulating layer 34. Thus, this structure allows a dense wiring of the wiring pattern 35a formed on the outer sides of the pad set 40. The internal pads 43 may be electrically connected to the external pads 41 and the external pads 41 may be electrically connected to other external pads 41. In such cases, the wiring pattern of the wiring pattern 35a can still be dense.

Figure 21:
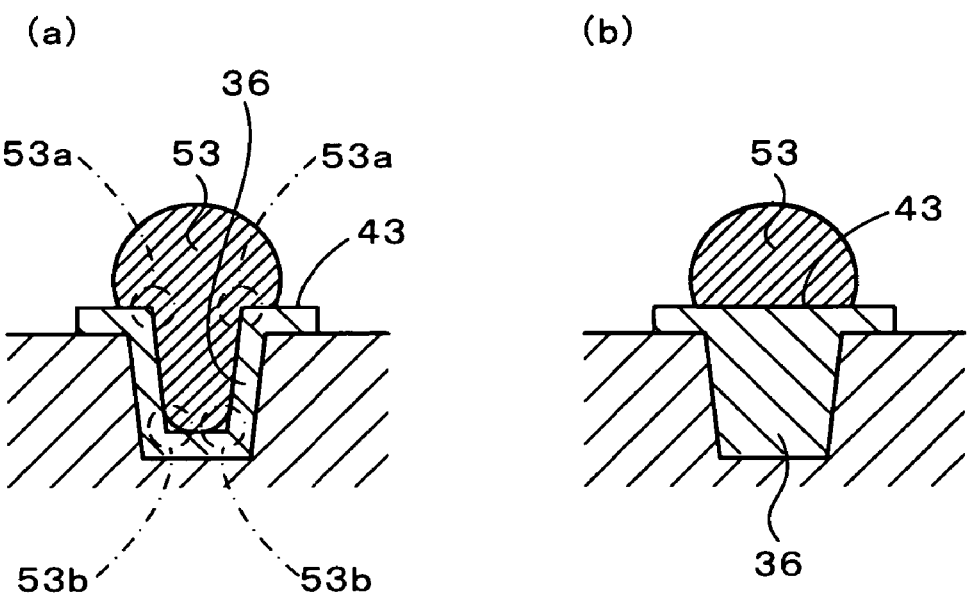
FIG. 21 shows sectional views of internal pads, where FIG. 21($a$) shows a sectional view of the case where an internal pad is arranged as an unfilled via hole and FIG. 21($b$) shows a sectional view of the case where an internal pad is arranged as a filled via hole (filled via).

In the semiconductor mounting board 80 described above, the internal pads 43 are formed as second via holes 36. When internal pads 43 are joined to the interposer 60 by solder bumps 53, angled portions 53a and voids 53b may thus be formed as shown in FIG. 21(a). However, since the internal pads 43 are short in the distances from the center in comparison to the external pads 41 and the shearing stress applied to the solder bumps 53 will thus be small, the solder bumps 53 will not break readily. Meanwhile, the external pads, due to being flat, do not give rise to angled portions 53a and voids 53b. The via holes 36 may be filled with a conducting material (such as copper or copper alloy) as shown in FIG. 21(b). With this structure, voids and angled portions will not be formed when internal pads 43 are joined to the interposer 60 by solder bumps 53 and stress will be less likely to concentrate, thus preventing breakage to occur. In FIG. 21(a), voids 53b formed at corners, that is, angled portions of the bottom surface of a via hole 36 are shown. However, voids do not necessarily form just at such corners of the bottom surface, and may form near the middle of the filling material when, for example, air is entrained during printing, and a void formed once may move to another location during reflow. The corners of the bottom surface of the via hole 36 are also angled portions, similarly to the angled portions 53a.

The interposer 60 is formed of ceramic and is thus high in rigidity. Since ceramic has a thermal expansion coefficient of a value intermediate the thermal expansion coefficient of the IC chip 70 and the thermal expansion coefficient of the multilayer printed wiring board 10 formed of resin (the core substrate and the insulating layers of the build-up layers are also formed of resin), it is preferable as the material of the interposer 60. When such a ceramic interposer 60 is used, the IC chip 70 and the multilayer printed wiring board 10 will be prevented from warping readily in the same direction due to the rigidity of the interposer and the connection reliability will tend to be lowered. However, since the external pads 41 are made flat in shape, the connection reliability can be maintained in the semiconductor mounting board 80 described above.

Furthermore, since external area Aext is the outermost surrounding array of the pad set 40, joining reliability is ensured for the portions at which external pads 41 of the outermost surrounding array are joined to the interposer 60, where the greatest shearing stress is applied. When the outermost surrounding array of the pad set 40 is referred to as a first surrounding array, external area Aext may be an area extending from the first surrounding array to the third surrounding array towards the inner side or an area extending from the first surrounding array to the fifth surrounding array towards the inner side. The joining reliability is thereby ensured for the portions at which pads near the outermost periphery are joined to the interposer 60, where a comparatively large shearing stress is applied.

Furthermore, since wiring pattern 35A, on which external pads 41 are formed, is joined to the first conductor layer 32 below through via holes 36 formed at positions that are external to external pads 41, the portions joining internal pads 43 to the first conductor layer 32 and the portions joining external pads 41 to the first conductor layer 32 can be formed without interference with each other.

In the semiconductor mounting board 80 described above, since all internal pads 43 are electrically connected through via holes 11 to the first conductor layer 32, there is no need to draw out wirings in external directions of the substrate on the second resin insulating layer 34, on which internal pads 43 are formed. Since wirings are thus not drawn out in external directions of the substrate from internal pads 43, the external pads 41 will not be an obstruction in comparison to cases where wirings are drawn out in external directions of the substrate from the internal pads 43. Also, since the wirings drawn out in external directions of the substrate from external pads 41 can be made dense and the overall wiring density can thus be high, and the respective pads 41 and 43 can be narrow in pitch interval to shorten the distance between any pair of diagonally positioned pads at the outermost surrounding array of the pad set 40 and reduce the shearing stress applied across pads.

EXAMPLES

As shown in the table of FIG. 22, Examples 1 to 8 and Comparative Example 1 of semiconductor mounting boards having external pads and internal pads were prepared in accordance with the manufacturing procedures described above for the embodiment, and with each Example and Comparative Example, an IC chip was mounted via the interposer. In each case, the pad set was formed by arranging 30 by 30 pads of 145 μmf to form a zigzag manner, and the distance between adjacent pads was set to 180 μm (see FIG. 22). In Comparative Example 1, the external pads were arranged as via holes and are connected to the first conductor layers below and the interiors of the holes were not filled with copper plating. With each of these semiconductor mounting boards, the electrical resistance of a specific circuit passing through the IC chip (the electrical resistance across a pair of electrodes, which are exposed on the surface at the side opposite the IC chip mounting surface of the IC chip mounting board and are continuous with the IC chip) was measured and this value was used as an initial value. The semiconductor mounting boards were then subject to a heat cycle test in which a cycle of −55° C. for 5 minutes and 125° C. for 5 minutes was repeated 1500 times. In this heat cycle test, the electrical resistance was measured at the 250th cycle, the 500th cycle, the 750th cycle, the 1000th cycle, and the 1500th cycle, and the percentages of variation with respect to the initial value (100×(measured value−initial value)/initial value (%)) were determined. The results are shown in the table of FIG. 22. In this table, cases wherein the percentage variation of the electrical resistance was within ±3% are indicated as being "especially good" (double circle), cases wherein the percentage variation of the electrical resistance was ±3 to 7% are indicated as being "good" (o), cases wherein the percentage variation of the electrical resistance was ±7 to 10% are indicated as being "normal" (Δ), and cases wherein the percentage variation of the electrical resistance exceeded ±10% are indicated as being "poor" (×). The specification required for a standard product was set to a percentage variation of within ±10% (that is an evaluation of double circle, o, or Δ) at the 1000th cycle.

As is clear from this table, in comparison to Comparative Example 1, the joining reliability was maintained over a longer term with all of Examples 1 to 8. It was also found that in Examples 5 to 8, wherein the internal pads are arranged as filled vias, the joining reliability is maintained over longer term than in Examples 1 to 4, wherein the internal pads were not arranged as filled vias. Furthermore, in comparison to cases (Examples 1 and 5) wherein just the outermost surrounding array of the pad set were arranged as external pads, better results were obtained in cases where multiple surrounding arrays of pads were arranged as external pads as in the cases (Examples 2 and 6) where the pads of the outermost surrounding array to the third surrounding array were arranged as external pads, the cases (Examples 3 and 7) where the pads of the outermost surrounding array to the fifth surrounding array were arranged as external pads, and the cases (Examples 4 and 8) where the pads of the outermost surrounding array to the tenth surrounding array were arranged as external pads.

Figure 23:
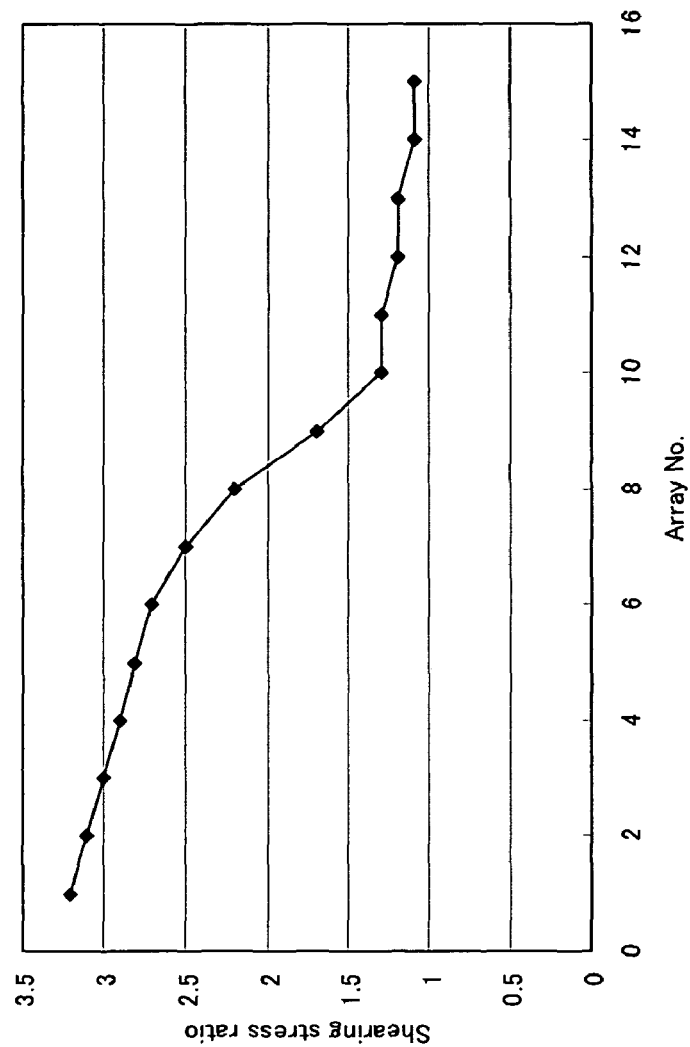
FIG. 23 shows a table and a graph of the results of a 3D strip simulation.

The relationship between the number (n) of surrounding arrays from the outermost periphery of the pad set and the shearing stress applied to the bumps of the n-th surrounding array from the outermost periphery/shearing stress applied to the bumps at a central portion (referred to hereinafter as the "shearing stress ratio") shall now be described. By performing 3D strip simulations while varying the number n of surrounding arrays from the outermost periphery in a semiconductor mounting board, the shearing stress ratios applied to the bumps from the outermost periphery to the n-th bump were calculated. In this semiconductor mounting board, the pad set was formed by arranging 30 by 30 pads of 145 μmf to form a zigzag manner and the distance between adjacent pads was set to 180 μm in the same manner as Examples 1 to 8 (see FIG. 22). The results are shown in the table and graph of FIG. 23. As is clear from FIG. 23, the shearing stress ratio applied to the n-th bumps from the outermost periphery was extremely high when n is 1 to 6, relatively low when n is 7 or later, and became lower and substantially fixed when n is 10 or later. It is thus preferable to arrange the external area to include from the outermost surrounding array to the sixth surrounding array and more preferably to the tenth surrounding array of the pad and to make each of the pads formed in the external area have a flat shape, in order to achieve the effect of the present invention.

Upon observing 100 solder bumps at the outermost periphery of each of Example 1 and Comparative Example 1 using an X-ray TV system (made by Shimadzu Corporation) and counting the number of solder bumps with voids of not less than 5 μm, it was found that the number was 0/100 for Example 1 and 10/100 for Comparative Example 1. This result also shows that the forming of solder bumps on external pads having a substantially flat shape is effective for improving the duration of the semiconductor mounting board. Other effects include that, resistance of the solder bumps is reduced, power is supplied to the IC smoothly, and erroneous operations do not occur. These effects become even greater when the internal pads are arranged as filled vias.

Figure 20:
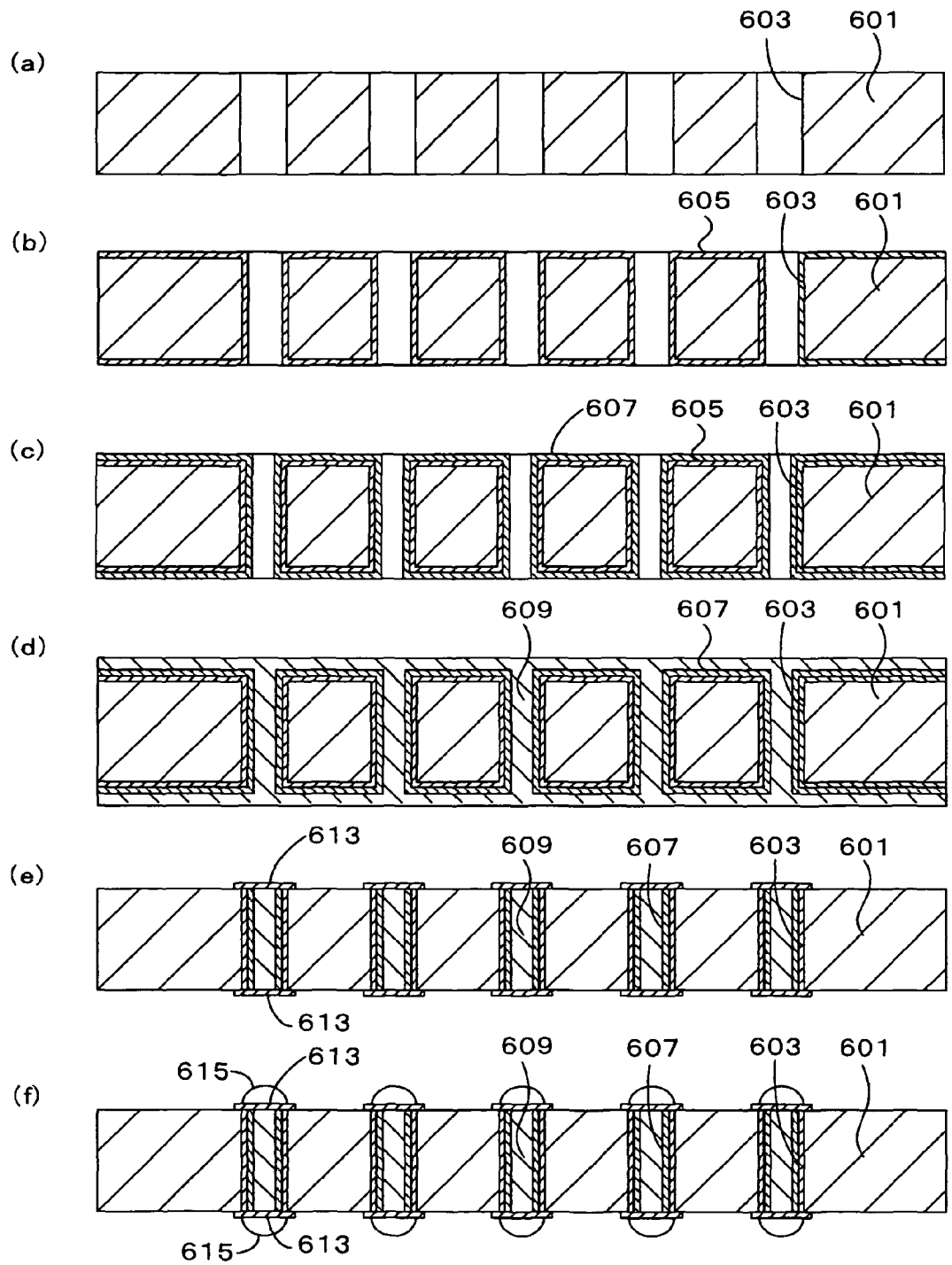
FIG. 20 is a diagram showing manufacturing process of an interposer.

As shown in the table of FIG. 24, Examples 9 to 28 of semiconductor mounting boards having external pads and internal pads were prepared in accordance with the manufacturing procedures described above for the embodiment, and with each Example, an IC chip was mounted via the interposer prepared in accordance with the manufacturing procedures shown in FIG. 20. With each Example, the thickness of the interposer was set to achieve the "thickness ratio" value of the table of FIG. 24 and the through holes were adjusted by changing the number of shots of sandblasting in FIG. 20(a) in accordance with the interposer thickness (setting the number of shots to the value obtained by multiplying the number of shots per unit thickness by the thickness of the interposer). Examples 9 to 28 were evaluated by conducting the same heat cycle test as described above. The results are shown together in the table of FIG. 24. The results of performing the heat cycle test on Examples 9 to 28 are compared while noting a value calculated from dividing the interposer thickness value by print wiring board (that is, core substrate and build-up layers) thickness value. It can be understood that it is preferable for the value thus calculated to be in the range of 0.1 to 0.8 and more preferably in the range of 0.2 to 0.4. It is presumed that a trend was exhibited wherein the evaluation result becomes poor when the interposer thickness/printed wiring board thickness is too small since the interposer cannot withstand the warping that occurs repeatedly during the heat cycles due to the interposer thickness being thin. It is also presumed that a trend was exhibited wherein the evaluation result becomes poor when the interposer thickness/printed wiring board thickness is too large since the interposer becomes unable to follow the warping of the IC chip and the printed wiring board due to being too high in rigidity.

Figure 25:
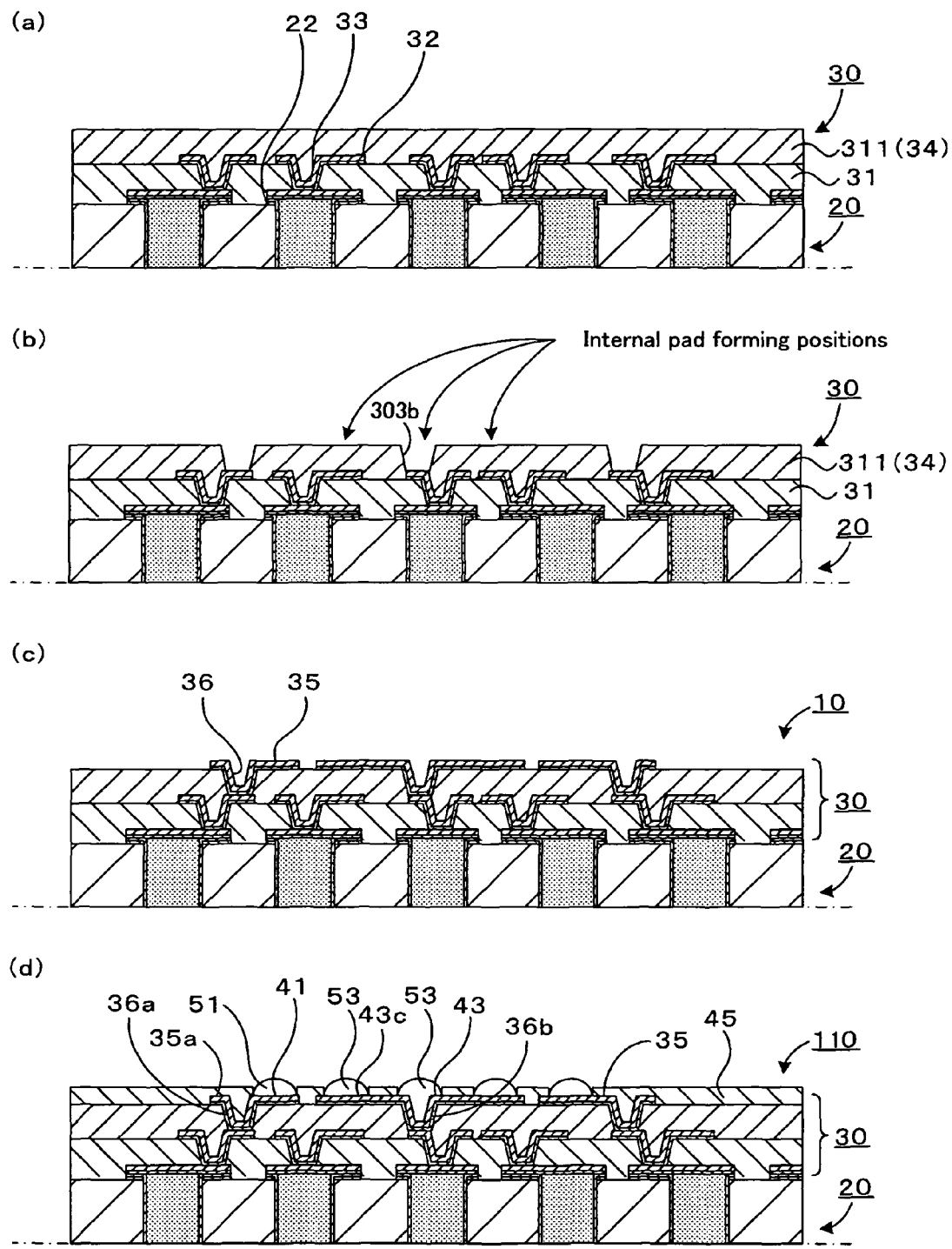
FIG. 25 is a manufacturing process diagram of another multilayer printed wiring board.

A multilayer printed wiring board 110 having the structure shown in FIG. 25D was manufactured in accordance with the manufacturing procedures described above for the embodiment. Here, after adhering insulating layer resin films 311 in the step of FIG. 15 (FIG. 25A is the same as FIG. 15), through holes were formed not at all positions at which internal pads 43 are to be formed but through holes 303b were formed at a portion of these positions (see FIG. 25B), and thereafter, second conductor layers 35 and second via holes 36 were formed (see FIG. 25C) and solder resist layers 45 and solder bumps 51 and 53 were formed to prepare the multilayer printed wiring board 110 (see FIG. 25D). The multilayer printed wiring board 110 has external pads 41, formed at substantially flat wiring portions of the wiring pattern 35a with via holes 36a of the second conductor layer 35, internal pads 43, formed at portions of the second conductor layer 35 at the inner sides of the external pads 41 and having via holes 36b, internal pads 43c, wired to the internal pads 43 by the second conductor layer 35, etc. That is, with multilayer printed wiring board 110, not all of internal pads 43 and 43c have via holes 36b but internal pads 43c, with which through holes are not formed, are arranged as portions of flat wirings as shown in FIG. 25D.

Examples 29 to 33 of multilayer printed wiring boards, shown in the table of FIG. 26, were prepared by the above manufacturing procedures. Here, the ratio of the number of via holes 36b with respect to the total number of internal pads 43 and 43c was adjusted by changing the data concerning the through hole forming positions that are input into a laser processing machine. The same interposer and IC chip as those of Example 1 were mounted onto each of these multilayer printed wiring boards, which were then evaluated by conducting heat cycle tests in the same manner as Example 1. The results are shown in FIG. 26. As is clear from this table of FIG. 26, the connection reliability is maintained over an even longer term when the ratio of the number of via holes 36b with respect to the total number of internal pads is one-third to two-thirds. As the ratio is smaller, the pitch of the pad was narrower and the printed wiring board was more compact. It is presumed that when the ratio becomes not more than two-thirds, the connection reliability is maintained over an even longer term since the printed wiring board becomes more compact and the shearing stress applied to the joining portions becomes small. However, when the ratio becomes less than one-third, since the number of via holes that pass through the second resin insulating layer (the outermost insulating layer of the build-up layer) becomes fewer, the second resin insulating layer becomes more readily deformed and the long-term connection reliability is thus lost somewhat.

The present invention claims benefit of priority to Japanese Patent Application No. 2004-047714 filed on Feb. 24, 2004, the contents of which are incorporated by reference herein in their entirety.

What is claimed is:

1. A semiconductor mounting board comprising:
   a core substrate;
   a build-up layer formed over the core substrate and comprising conductor layers having a wiring pattern formed thereon and insulating layers alternately laminated;
   a pad set comprising a plurality of pads formed on an outermost insulating layer of the build-up layer and positioned to receive an interposer, the plurality of pads comprising a plurality of internal pads and a plurality of external pads surrounding the internal pads; and
   an interposer provided over the build-up layer and electrically connected to the pad set, the interposer being configured to mount an electronic component on a side of the interposer which is opposite to a side of the build-up layer, wherein the plurality of external pads is formed in an external area of the pad set, and have a substantially flat shape, wherein at least one of the core substrate and the insulating layers in the build-up layer comprise resin, and the interposer comprises ceramic and has a thickness which is set to 0.1 to 0.8 times a thickness of the semiconductor mounting board having the core substrate and the build-up layer, wherein the plurality of internal pads has a ratio of the internal pads formed as via holes with respect to a total number of the internal pads in the range of ⅓ to ⅔, and each via hole of the internal pads is filled with a conductive material, and the external pads are included in an area from a first surrounding array to an n-th surrounding array, where n is an integer from 2 to 10, with the first surrounding array being the outermost surrounding array of the pad set.

2. The semiconductor mounting board according to claim 1, wherein the external pads are connected to a wiring pattern that is formed at portions of an outermost conductor layer on the outermost insulating layer and at the outer sides of the pad set, and the internal pads of the pad set, which are formed in an internal area at the inner side of the external area, are connected to one of the external pads and a conductor layer formed below the outermost insulating layer.

3. The semiconductor mounting board according to claim 2, wherein the internal pads formed as via holes comprise a plurality of via holes that pass through the outermost insulating layer.

4. The semiconductor mounting board according to claim 2, wherein the plurality of internal pads includes at least two internal pads electrically connected to each other on or above the substantially same surface as the top surface of the internal pads and formed as via holes that pass through the outermost insulation layer.

5. The semiconductor mounting board according to claim 1, wherein the core substrate and the insulating layers in the build-up layer each comprise resin, and the interposer comprises ceramic.

6. The semiconductor mounting board according to claim 1, wherein the interposer has a thickness which is set to 0.2 to 0.4 times a thickness of the semiconductor mounting board having the core substrate and the build-up layer.

7. The semiconductor mounting board according to claim 1, wherein the external pads are formed at the outermost surrounding array of the pad set.

8. The semiconductor mounting board according to claim 1, wherein the pad set includes pads arranged in at least 30 by 30 square pattern.

9. The semiconductor mounting board according to claim 1, wherein every one of the pads in the external region of the pad set is substantially flat.

10. The semiconductor mounting board according to claim 1, wherein the plurality of external pads are arranged in at least one array surrounding the internal pads.

11. A semiconductor mounting board comprising:
a core substrate;
a build-up layer formed over the core substrate and comprising conductor layers having a wiring pattern formed thereon and insulating layers alternately laminated;
a pad set comprising a plurality of pads formed on an outermost insulating layer of the build-up layer and positioned to receive an interposer, the plurality of pads comprising a plurality of internal pads and an array of external pads surrounding the internal pads; and
an interposer provided over the build-up layer and electrically connected to the pad set, the interposer being configured to mount an electronic component on an opposite side of the built-up layer,
wherein each of the external pads in the array of external pads is formed in an external area of the pad set, and every one of the pads in the external region of the pad set has a substantially flat shape,
wherein the interposer comprises ceramic and has a thickness which is set to 0.1 to 0.8 times a thickness of the semiconductor mounting board having the core substrate and the build-up layer,
wherein the plurality of internal pads has a ratio of the internal pads formed as the via holes with respect to a total number of the internal pads in the range of ⅓ to ⅔, and each via hole of the internal pads is filled with a conductive material, and
the external pads are included in an area from a first surrounding array to an n-th surrounding array, where n is an integer from 2 to 10, with the first surrounding array being the outermost surrounding array of the pad set.

* * * * *